(12) United States Patent
Bessho

(10) Patent No.: US 6,387,794 B2
(45) Date of Patent: *May 14, 2002

(54) ELECTRODE STRUCTURE FOR SEMICONDUCTOR DEVICE, METHOD FOR FORMING THE SAME, MOUNTED BODY INCLUDING SEMICONDUCTOR DEVICE AND SEMICONDUCTOR DEVICE

(75) Inventor: Yoshihiro Bessho, Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/197,334

(22) Filed: Nov. 19, 1998

Related U.S. Application Data

(62) Division of application No. 08/679,894, filed on Jul. 15, 1996, now abandoned.

(30) Foreign Application Priority Data

Jul. 14, 1995 (JP) ............................................. 7-178386

(51) Int. Cl.[7] ........................... H01L 21/44; H01L 23/48
(52) U.S. Cl. ....................... 438/613; 438/617; 438/660; 257/688; 257/689
(58) Field of Search ................................ 438/109, 613, 438/617, 660, 666, 686, 688, 108; 257/688, 689

(56) References Cited

U.S. PATENT DOCUMENTS

| | | | |
|---|---|---|---|
| 4,258,382 A | | 3/1981 | Harris |
| 5,014,111 A | * | 5/1991 | Tsuda .......................... 257/737 |
| 5,124,277 A | * | 6/1992 | Tsumura ...................... 438/617 |
| 5,172,212 A | | 12/1992 | Baba |
| 5,272,111 A | | 12/1993 | Kosaki |
| 5,436,503 A | | 7/1995 | Kunitomo et al. |
| 5,508,561 A | | 4/1996 | Tago et al. |

FOREIGN PATENT DOCUMENTS

| | | | | |
|---|---|---|---|---|
| JP | 59-161852 | | 9/1984 | |
| JP | 363216352 A | * | 9/1988 | ........... H01L/21/60 |
| JP | 2-21622 | | 1/1990 | |
| JP | 3-295247 | | 12/1991 | |
| JP | 3295247 | * | 12/1991 | |
| JP | 406097230 A | * | 4/1994 | ........... H01L/21/60 |

* cited by examiner

Primary Examiner—Charles Bowers
Assistant Examiner—Nema Berezny
(74) Attorney, Agent, or Firm—Merchant & Gould PC

(57) ABSTRACT

An electrode structure for a semiconductor device and a method for forming the electrode structure, and a mounted body including the semiconductor device are provided in which the semiconductor device can be easily connected to a circuit board with high reliability. An aluminum electrode is formed on an IC substrate. A passivation film is formed on the IC substrate so as to cover the peripheral portion of the aluminum electrode. A bump electrode is formed on the aluminum electrode by a wire bonding method. An aluminum oxide film is formed on the surface of the aluminum electrode that is exposed around the bump electrode. A conductive adhesive is applied as a bonding layer to the tip portion of the bump electrode of the semiconductor device by a transfer method or a printing method. The semiconductor device is aligned in the face-down state in such a manner that the bump electrode abuts on a terminal electrode of a circuit board, and is provided on a circuit board. In this state, the conductive adhesive is hardened. A gap between the IC substrate and the circuit board is filled with an insulating resin.

4 Claims, 3 Drawing Sheets

ELECTRODE STRUCTURE FOR SEMICONDUCTOR DEVICE, METHOD FOR FORMING THE SAME, MOUNTED BODY INCLUDING SEMICONDUCTOR DEVICE AND SEMICONDUCTOR DEVICE

"This application is a Divisional of application Ser. No. 08/679,894, filed Jul. 15, 1996, now abandoned which application(s) are incorporated herein by reference."

FIELD OF THE INVENTION

The present invention relates to an electrode structure for a semiconductor device mounted on a circuit board and a method for forming the electrode structure, and a mounted body including the semiconductor device, and more particularly to an electrode structure for a semiconductor device mounted on a circuit board in the face-down state and a method for forming the electrode structure, and a mounted body including the semiconductor device.

BACKGROUND OF THE INVENTION

Conventionally, a semiconductor device is often mounted on a circuit board by soldering. In recent years, however, the package for the semiconductor device has been small-sized and the number of connecting terminals has been increased. Consequently, the space between the connecting terminals has been reduced. Thus, it has become gradually harder to apply the soldering technique according to the prior art.

A method for directly attaching the semiconductor device onto the circuit board to reduce the mounting area so that the circuit board can be used efficiently has been proposed. In particular, the following mounting method is considered effective because the mechanical strength obtained after connecting the semiconductor device to the circuit board is great and direct connection can be performed (for example, "Microelectronics Packaging Handbook; Nikkei BP published on Mar. 27, 1991"). According to the above-mentioned method, a semiconductor device having an electrode structure is manufactured in which a deposited film such as an adherence metal or a diffusion preventive metal is formed on an aluminum electrode in advance when connecting the semiconductor device to the circuit board and a bump electrode made of a solder is formed on the deposited film by a plating method, and the semiconductor device is provided on the circuit board in the face-down state and heated at a high temperature so that the solder (bump electrode) and the terminal electrode of the circuit board are fused.

According to this method for forming the bump electrode, the electrode structure is complicated so that a lot of steps are necessary. For this reason, a method for easily forming the bump electrode on the aluminum electrode of the semiconductor device by using the wire bonding technique has been proposed (for example, Japanese Unexamined Patent Application No. 49-52973).

An example of the electrode structure for a semiconductor device and a method for forming the electrode structure and the mounted body including the semiconductor device according to the prior art will be described below with reference to the drawings. FIG. 3 is a sectional view showing the electrode structure for the semiconductor device according to the prior art. FIG. 4 is a sectional view showing the mounted body including the semiconductor device according to the prior art.

As shown in FIG. 3, an aluminum electrode 11 is formed on an IC substrate 10. A passivation film 13 is formed on the IC substrate 10 so as to cover the peripheral portion of the aluminum electrode 11. A bump electrode 12 is formed on the aluminum electrode 11 by a wire bonding method.

As shown in FIG. 4, the semiconductor device having the bump electrode 12 is aligned in the face-down state in such a manner that the bump electrode 12 closely comes in contact with a terminal electrode 15 of a circuit board 14, and is provided on the circuit board 14. The bump electrode 12 and the terminal electrode 15 are fused together by thermo-compression bonding or ultrasonic welding. Thus, a mounted body including the semiconductor device is obtained.

However, the semiconductor device having the above-mentioned electrode structure and the mounted body including the semiconductor device have the following problems.

More specifically, the aluminum electrode is exposed around the bump electrode. For this reason, if water exists in the exposed aluminum electrode portion, there is a possibility that aluminum flows out in a comparatively short time so that the semiconductor device is not electrically conducted to the circuit board. In order to enhance the reliability of a junction, it has been proposed to fill a gap between the semiconductor device and the circuit board with an insulating resin. In this case, however, there is a possibility that impurity ions such as chlorine contained in the insulating resin promote the corrosion of the aluminum electrode so that the semiconductor device is not electrically conducted to the circuit board. In the case where an organic board such as a glass epoxy board is used for light weight and low cost, the corrosion of the aluminum electrode becomes more serious because the organic board is generally permeable to water and a lot of impurity ions are present in the organic board.

SUMMARY OF THE INVENTION

In order to solve the above-mentioned problems in the prior art, it is an object of the present invention to provide an electrode structure for a semiconductor device and a method for forming the electrode structure and a mounted body including the semiconductor device in which the semiconductor device can be easily connected to a circuit board reliably.

To accomplish the above-mentioned object, the present invention provides an electrode structure for a semiconductor device which is suitable for mounting on a circuit board in the face-down state, comprising a bump electrode formed on an aluminum electrode of the semiconductor device; and an aluminum oxide film sufficient for the prevention of corrosion of the aluminum electrode, which is formed on a surface of the aluminum electrode exposed around the bump electrode. According to the electrode structure for the semiconductor device, the aluminum electrode is not corroded due to water and impurity ions when mounting the semiconductor device on the circuit board.

In the electrode structure for a semiconductor device according to the present invention, it is preferable that the aluminum oxide film for the prevention of corrosion should be obtained by further oxidizing a natural oxide film on the surface of the aluminum electrode.

In the electrode structure for a semiconductor device according to the present invention, it is preferable that the thickness of the aluminum oxide film should be 5 to 20% of the thickness of the aluminum electrode. According to the preferred example, a practical electrode structure for the semiconductor device can be obtained. In other words, the thickness of the aluminum oxide film which is smaller than 5% of the thickness of the aluminum electrode is not practical because it is very hard to form the aluminum oxide film densely. Furthermore, the thickness of the aluminum oxide film which is greater than 20% of the thickness of the aluminum electrode is not practical because the resistance value of the aluminum electrode portion is increased too much.

In the electrode structure for a semiconductor device according to the present invention, it is preferable that the thickness of the aluminum oxide film should be 0.05 to 0.2 $\mu$m. According to the preferred example, a practical electrode structure for the semiconductor device can be obtained. In general, the thickness of the aluminum electrode is about 1 $\mu$m. Consequently, the aluminum oxide film having a thickness of 5 to 20% of the thickness of the aluminum electrode can be obtained.

In the electrode structure for a semiconductor device according to the present invention, it is preferable that the bump electrode should be made of Au. According to the preferred example, the surface of the bump electrode is not oxidized at the step of forming an oxide film on the aluminum electrode of the semiconductor device. Accordingly, the bump electrode made of Au is convenient for the following bonding step. The reason is that if an oxide film is formed between the bonding layer and the surface of the bump electrode, a good electrical conduction cannot be obtained.

The present invention provides a method for forming an electrode structure for a semiconductor device which is mounted on a circuit board in the face-down state, comprising the steps of forming a bump electrode on an aluminum electrode of the semiconductor device; and forming an aluminum oxide film sufficient for the prevention of corrosion on a surface of the aluminum electrode that is exposed around the bump electrode. According to the method for forming the electrode structure for a semiconductor device, it is possible to obtain a semiconductor device in which the aluminum oxide film for the prevention of corrosion is formed on the surface of the aluminum electrode. As a result, the aluminum electrode is not corroded due to water and impurity ions when mounting the semiconductor device on the circuit board.

In the method for forming the electrode structure for a semiconductor device according to the present invention, it is preferable that the bump electrode should be formed by a wire bonding method using a Au wire. For example, the bump electrode is formed by the wire bonding method in the following manner. First of all, the tip of the Au wire is fused by thermal energy to form a Au ball. Then, the Au ball formed on the tip of the Au wire is put on the aluminum electrode. Thereafter, a pressure of about 50 g is applied to the Au ball formed on the tip of the Au wire at a temperature of about 150° C. so as to be bonded onto the aluminum electrode by pressure. Finally, the Au wire is pulled upward. After the above-mentioned steps, the bump electrode made of Au is formed on the aluminum electrode. According to the preferred example, the bump electrode can be formed directly on the aluminum electrode (a general electrode material) of the semiconductor device. Consequently, the bump electrode can be formed easily on the general purpose semiconductor device.

In the method for forming the electrode structure for a semiconductor device according to the present invention, it is preferable that the aluminum oxide film should be formed by exposing the semiconductor device having the bump electrode formed thereon to the high-temperature state. According to the preferred example, the aluminum oxide film can be formed efficiently in a short time. In this case, the high-temperature state should have a temperature of 200 to 300° C. According to the preferred example, this temperature range does not have a bad influence on the semiconductor device itself, that is, disconnection of an internal wiring or the like. Consequently, the aluminum oxide film can be formed efficiently in a short time. Furthermore, it is preferable that the aluminum oxide film should be formed simultaneously at the step of forming the bump electrode at a temperature of 200 to 300° C. According to the preferred example, the steps of forming the electrode structure for the semiconductor device can be simplified.

In the method for forming the electrode structure for a semiconductor device according to the present invention, the aluminum oxide film should be formed by immersing the semiconductor device having the bump electrode formed thereon in ammonium persulfate or hydrogen peroxide. According to this preferred example, the aluminum oxide film can be formed efficiently in a short time.

The present invention provides a mounted body including a semiconductor device, comprising a circuit board having a terminal electrode and a semiconductor device mounted on the circuit board in the face-down state, a bump electrode formed on an aluminum electrode of the semiconductor device and an aluminum oxide film sufficient for the prevention of corrosion that is formed on the surface of the aluminum electrode exposed around the bump electrode, the bump electrode being electrically connected to the terminal electrode on the circuit board through a bonding layer. With the present mounted body including a semiconductor device, the aluminum electrode is not corroded due to water and impurity ions. As a result, there is no possibility that the semiconductor is not electrically conducted to the circuit board. Consequently, a mounted body including a semiconductor device having high reliability can be obtained.

In the structure for the mounted body including a semiconductor device according to the present invention, it is preferable that the circuit board should be formed from a board including an organic material. According to the preferred example, the following functions and effects can be obtained. Recently, a board containing an organic material such as a glass epoxy board, a paper phenol board or the like has been used as a circuit board for light weight and low cost. This kind of board is permeable to water and contains a lot of impurity ions therein. However, the aluminum oxide film for the prevention of corrosion is formed on the surface of the aluminum electrode that is exposed around the bump electrode. Consequently, the aluminum electrode is not corroded due to water and impurity ions. According to the preferred example, it is possible to prevent the corrosion of the aluminum electrode while obtaining a reduction in weight and cost of the semiconductor device.

In the structure for the mounted body including a semiconductor device according to the present invention, it is preferable that the aluminum oxide film for the prevention of corrosion should be obtained by further oxidizing a natural oxide film on the surface of the aluminum electrode.

In the structure for the mounted body including a semiconductor device according to the present invention, it is preferable that the bonding layer should be made of a conductive adhesive. The conductive adhesive is obtained by mixing an organic binder, which contributes to adhesion, and a conductive filler, which contributes to electric conduction. An epoxy resin, a polyimide resin and the like are used as the organic binder. Ag, Cu, Au, Pd, Ni and the like having a mean volume particle diameter of 2 to 5 μm are used as a conductive filler In the case where the epoxy resin is used as the organic binder, the content of the conductive filler is 60 to 70% by weight. An amine hardening agent or a phenol hardening agent is used. In the case where the polyimide resin is used as the organic binder, the content of the conductive filler is 60 to 90% by weight and the hardening temperature is about 200° C. According to the preferred example, the thermal stress on the junction caused by the mismatching of physical property values (in particular, coefficients of thermal expansion) of the semiconductor device and the circuit board is relaxed. Thus, the mounted body including a semiconductor device can be obtained with high reliability. The reason is that the conductive adhesive has excellent relaxation ability in stress because it is generally softer than an inorganic material such as a solder.

In the structure for the mounted body including a semiconductor device according to the present invention, it is preferable that the bonding layer should be made of a solder. According to the preferred example, the semiconductor device can be mounted at the same steps as the mounting of parts other than the semiconductor device, for example, a chip resistor, a chip capacitor and the like. As a result, the semiconductor device can also be mounted at the reflow soldering step together with other parts than the semiconductor device. Consequently, the process can be simplified.

In the structure for the mounted body including a semiconductor device according to the present invention, it is preferable that a gap between the semiconductor device and the circuit board should be filled with an insulating resin. An example of the insulating resin is an epoxy resin. According to the preferred example, the junction of the semiconductor device and the semiconductor device itself can be protected. In particular, the influence of water under high humidity conditions, such as the degradation of the junction or the failure of the semiconductor device, can be eliminated.

In the structure for the mounted body including a semiconductor device according to the present invention, it is preferable that the thickness of the aluminum oxide film should be 5 to 20% of the thickness of the aluminum electrode.

In the structure for the mounted body including a semiconductor device according to the present invention, it is preferable that the thickness of the aluminum oxide film should be 0.05 to 0.2 μm.

In the structure for the mounted body including a semiconductor device according to the present invention, it is preferable that the bump electrode should be made of Au.

The present invention provides a semiconductor device suitable for mounting on a circuit board, comprising an aluminum electrode; a bump electrode formed on the aluminum electrode; and an aluminum oxide film sufficient for the prevention of corrosion of the aluminum electrode, which is formed on a surface of the aluminum electrode exposed around the bump electrode.

According to the electrode structure for the semiconductor device of the present invention, the aluminum electrode is not corroded due to water and impurity ions when mounting the semiconductor device on the circuit board.

According to the method for forming the electrode structure for the semiconductor device of the present invention, the semiconductor device in which the aluminum oxide film is formed on the surface of the aluminum electrode is obtained. As a result, the aluminum electrode is not corroded due to water and impurity ions when mounting the semiconductor device on the circuit board.

According to the mounted body including the semiconductor device of the present invention, the aluminum electrode is not corroded due to water and impurity ions. As a result, possibility that the semiconductor device is not electrically conducted to the circuit board is greatly reduced. Consequently, it is possible to obtain the mounted body including the semiconductor device which is very stable and reliable.

DETAILED DESCRIPTION OF THE INVENTION

A preferred embodiment of the present invention will be described below.

Figure 1A:
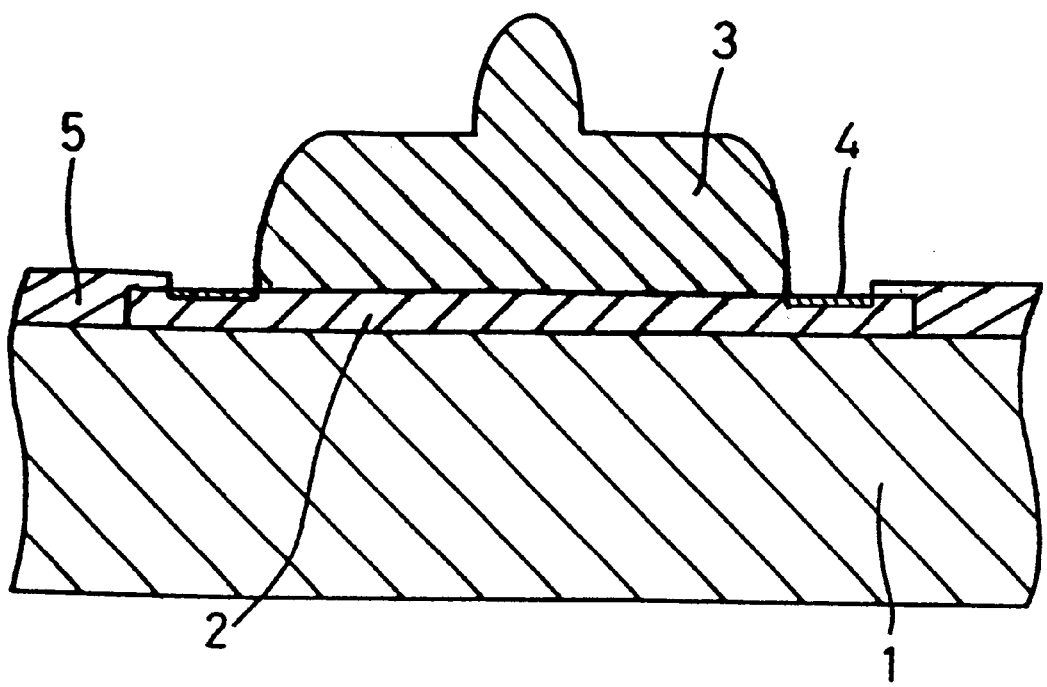
FIG. 1 is a sectional view showing an electrode structure for a semiconductor device according to an embodiment of the present invention.
Figure 1B:
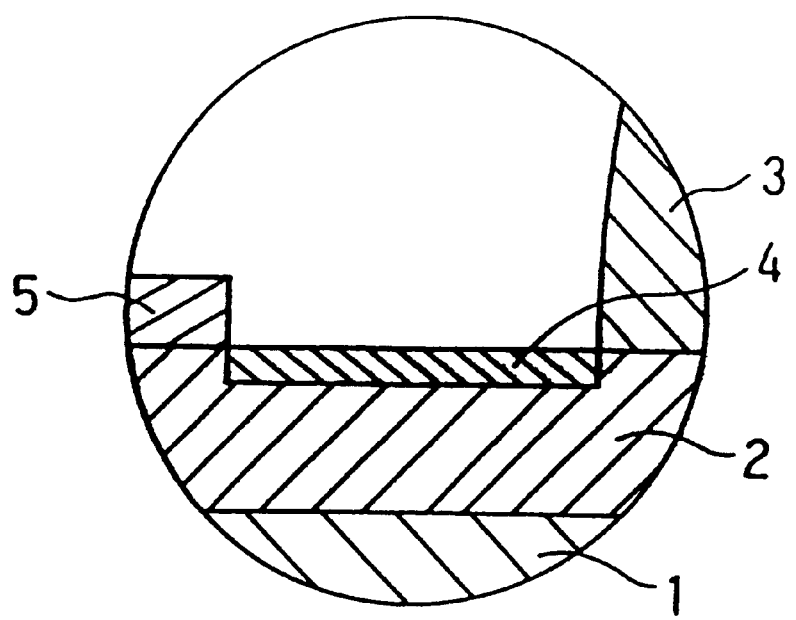
Figure 2:
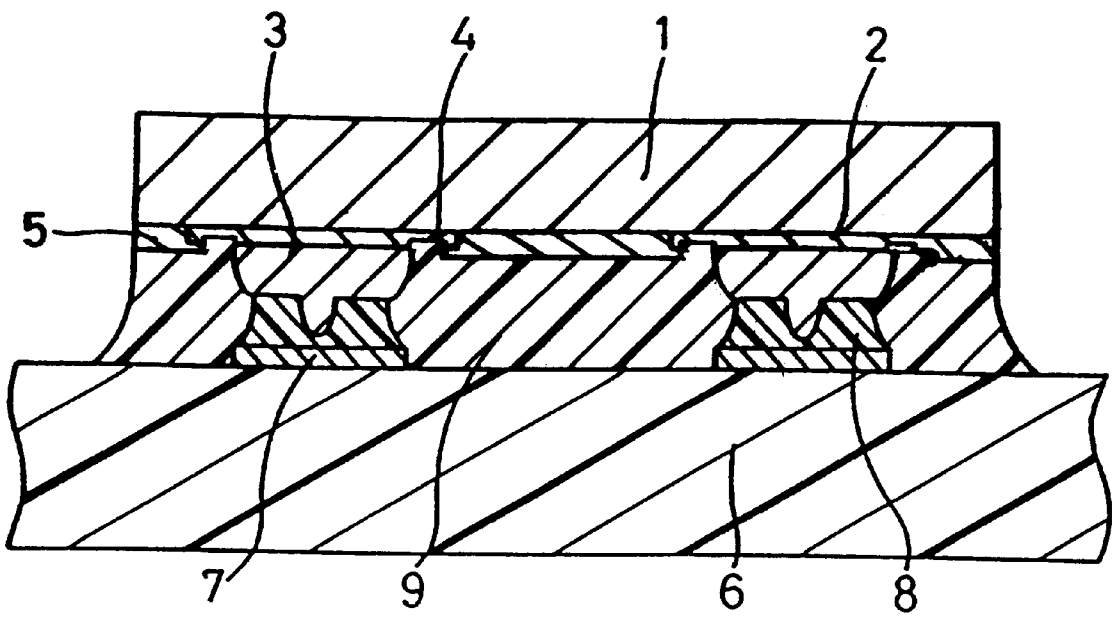
FIG. 2 is a sectional view showing a mounted body including the semiconductor device according to the embodiment of the present invention.
Figure 3:
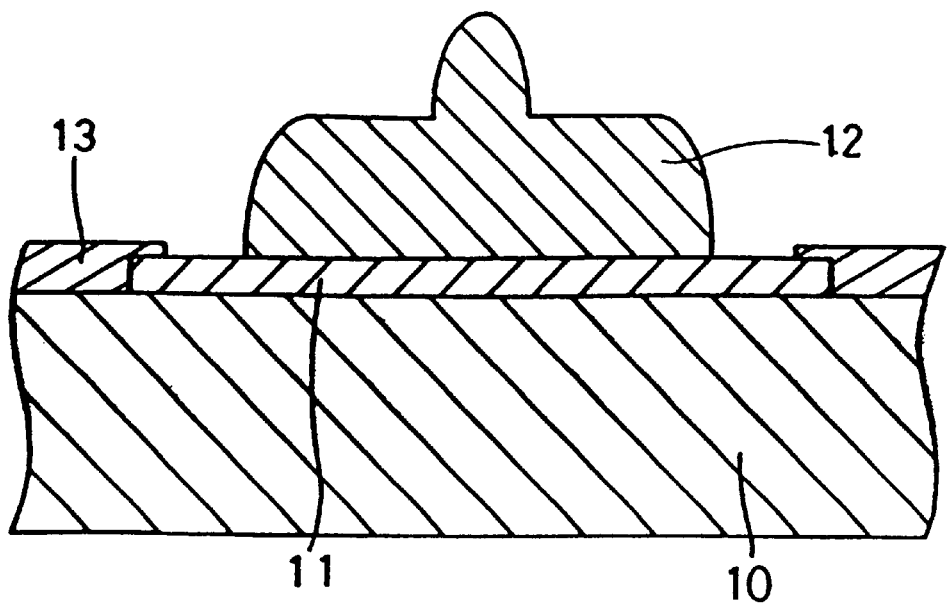
FIG. 3 is a sectional view showing an electrode structure for the semiconductor device according to the prior art.
Figure 4:
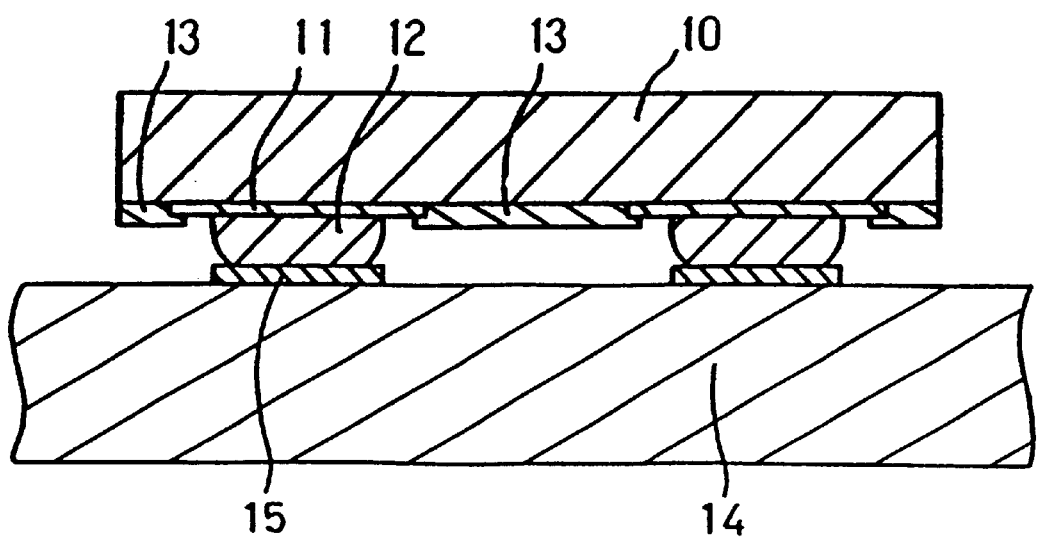
FIG. 4 is a sectional view showing a mounted body including the semiconductor device according to the prior art.

FIG. 1 is a sectional view showing an electrode structure for a semiconductor device according to an embodiment of the present invention. FIG. 2 is a sectional view showing a mounted body including the semiconductor device according to the embodiment of the present invention.

As shown in FIG. 1, an aluminum electrode 2 is formed on an IC substrate 1. A passivation film 5 made of $SiO_2$ is formed on the IC substrate 1 so as to cover the peripheral portion of the aluminum electrode 2. A bump electrode 3 is formed on the aluminum electrode 2 by a wire bonding method. The aluminum electrode 2 has an aluminum oxide film 4 formed on the surface which is exposed around the bump electrode 3. If the aluminum oxide film 4 is formed on the surface of the aluminum electrode 2 that is exposed around the bump electrode 3, the aluminum electrode 2 that is not corroded due to water and impurity ions when the semiconductor device is mounted on the circuit board. The bump electrode 3 is generally formed by the wire bonding method at a comparatively low temperature of about 150° C. The IC substrate 1 having about 100 aluminum electrodes 2 only passes through a heat history at a temperature of 150° C. for a very short time of about 10 secs. For this reason, a natural oxide film formed on the surface of the aluminum electrode 2 during wire bonding has a thickness of about 0.01 μm and is porous, and is not sufficient to prevent the corrosion of the aluminum electrode 2.

It is preferable that the thickness of the aluminum oxide film 4 should be 5 to 20% of the thickness of the aluminum electrode 2. In general, the thickness of the aluminum electrode 2 of the semiconductor device is about 1 μm. In this case, it is sufficient that the thickness of the aluminum oxide film 4 is about 0.1 μm. If the aluminum oxide film 4 is dense (there is no pin hole), the thickness of the aluminum oxide film 4 may be smaller, that is, about 0.05 μm. The thickness of the aluminum oxide film 4 which is smaller than 5% of the thickness of the aluminum electrode 2, that is, 0.05 μm, is not practical because it is very hard to form the aluminum oxide film 4 densely. Furthermore, the thickness of the aluminum oxide film 4 which is greater than 20% of the thickness of the aluminum electrode 2, that is, 0.2 μm, is not practical because the resistance value of the aluminum electrode portion is increased too much.

By way of example, the aluminum oxide film 4 can be formed by exposing the IC substrate 1 having the bump electrode 3 provided thereon to the high-temperature state (for example, 300° C.) in the air. More specifically, the aluminum oxide film 4 can be formed by a thermal oxidation method. Thus, the aluminum oxide film 4 can be formed efficiently in a short time by using the thermal oxidation method. In this case, it is preferable that the high-temperature state should have a temperature of 200 to 300° C.

It is preferable that the bump electrode 3 should be made of Au. The bump electrode 3 made of Au is convenient for the following bonding step because the surface of the bump electrode 3 is not oxidized at the step of forming an oxide film on the aluminum electrode 2. This is important because if an oxide film is formed between the bonding layer and the surface of the bump electrode 3, a good electric conduction cannot be obtained. In this case, the bump electrode 3 can be directly formed on the aluminum electrode (a general electrode material) 2 by the wire bonding method using a Au wire in the same manner as in the present embodiment. Consequently, the bump electrode can be easily formed on a general purpose semiconductor device. In general, the bump electrode is formed by a plating method. In this case, a thin film such as an adherence layer or a diffusion preventive layer is formed on the aluminum electrode and the bump electrode is then formed on the thin film. For this reason, the complicated process and apparatus are required.

The formation of the bump electrode 3 by the wire bonding method will be briefly described below. First of all, the tip of the Au wire is fused by thermal energy to form a Au ball. Then, the Au ball formed on the tip of the Au wire is put on the aluminum electrode. Thereafter, a pressure of about 50 g is applied to the Au ball formed on the tip of the Au wire at a temperature of about 150° C. so as to be bonded onto the aluminum electrode by pressure. Finally, the Au wire is pulled upward. After these steps, the bump electrode 3 made of Au is formed on the aluminum electrode 2. By setting a heating temperature to the high-temperature state during wire bonding, that is, 200 to 300° C., the bump electrode 3 can be formed on the aluminum electrode 2 and the aluminum oxide film 4 can be formed on the surface of the aluminum electrode 2 that is exposed around the bump electrode 3. If the bump electrode 3 and the aluminum oxide film 4 are formed at the same time, the step of forming the electrode structure for the semiconductor device can be simplified.

The method for manufacturing the mounted body including the semiconductor device will be described below. As shown in FIG. 2, a conductive adhesive 8 is applied as a bonding layer to the tip portion of the bump electrode 3 of the semiconductor device having the above-mentioned structure by a transfer method or a printing method. Then, the semiconductor device is aligned in the face-down state in such a manner that the bump electrode 3 abuts on the terminal electrode 7 of the circuit board 6. Then, the semiconductor device is mounted on the circuit board 6. When the conductive adhesive 8 is hardened in this state, the IC substrate 1 can be electrically connected to the circuit board 6. Finally, a gap between the IC substrate 1 and the circuit board 6 is filled with an insulating resin 9 such as an epoxy resin so that the mounted body including the semiconductor device can be obtained. By filling the gap between the IC substrate 1 and the circuit board 6 with the insulating resin 9, the junction between the board and the IC substrate 1 and the IC substrate 1 itself can be protected. In particular, it is possible to eliminate the influence of water at a high humidity, that is, the degradation of the junction and the failure of the semiconductor device. In the mounted body including the semiconductor device, the above-mentioned IC substrate 1, that is, the IC substrate 1 in which the surface is exposed around the bump electrode 3; is used and has the aluminum oxide film 4 formed thereon. Therefore, the aluminum electrode 2 is not corroded due to water and impurity ions. As a result, there is a greatly reduced possibility that the IC substrate 1 is not electrically conducted to the circuit board 6. Consequently, it is possible to obtain the mounted body including the semiconductor device with high reliability. In addition, it is possible to use, for the circuit board 6, an organic board such as a glass epoxy board which is permeable to water and contains a lot of impurity ions. Consequently, the weight and size of the semiconductor device can be reduced. An epoxy resin which is generally used as the insulating resin 9 is closely bonded to the metal surface by causing a hydroxyl group in the resin to generate hydrogen bonding with an oxide on the metal surface. By using a structure in which the aluminum oxide film 4 is formed on the surface of the aluminum electrode 2 exposed around the bump electrode 3 as in the present embodiment, the adhesion strength on an interface between the insulating resin 9 and the aluminum electrode 2 is enhanced. Thus, the sealing effect of the insulating resin 9 can be enhanced still more.

If the conductive adhesive 8 is used as a bonding layer, the thermal stress on the junction caused by the mismatching of physical property values (in particular, coefficients of thermal expansion) of the IC substrate 1 with the circuit board 6 is relaxed so that the mounted body including the semiconductor device can be obtained with high reliability. The reason is that the conductive adhesive has excellent relaxation ability in stress because it is softer than an inorganic material such as a solder. The conductive adhesive is obtained by mixing an organic binder which contributes to adhesion with a conductive filler which contributes to electric conduction. An epoxy resin, a polyimide resin and the like are used as the organic binder. Ag, Cu, Au, Pd, Ni and the like which have a mean volume particle diameter of 2 to 5 μm are used as the conductive filler. If the epoxy resin is used for the organic binder, the content of the conductive filler is 60 to 70% by weight and amine and phenol hardening agents are used. If the polyimide resin is used as the organic binder, the content of the conductive filler is 60 to 90% by weight and the hardening temperature is about 200° C.

In the present embodiment, the bump electrode 3 is formed by the wire bonding method, which should not be construed as being restricted. If the bump electrode 3 is directly formed on the aluminum electrode 2, an electroless plating method may be used.

While the conductive adhesive 8 is formed as the bonding layer on the bump electrode 3 by the transfer method or the printing method, the bonding layer instead may be formed on the terminal electrode 7 of the circuit board 6 in advance.

While the conductive adhesive 8 is used as the bonding layer in the present embodiment, other bonding materials such as a solder may be used. In particular, if the solder is used as the bonding layer, the semiconductor device can be mounted at the same steps as the mounting of parts other than the semiconductor device, for example, a chip resistor, a chip capacitor and the like. As a result, the semiconductor device can collectively be mounted at the reflow soldering step together with parts other than the semiconductor device. Consequently, the process can be simplified.

While the aluminum oxide film 4 is formed by the thermal oxidation method in the present embodiment, another method for oxidizing the surface of the aluminum electrode 2 may be used. As one example, the semiconductor device having the bump electrode 3 formed thereon is immersed in ammonium persulfate or hydrogen peroxide so as to form the aluminum oxide film 4.

While the semiconductor device which is mounted on the circuit board in the face-down state has been described as an example in the present embodiment, the present invention can be applied to the case where other mounting methods are used.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A method for forming a mounted body including a semiconductor device, in which the semiconductor device is mounted on a circuit board in a face-down state, comprising:

forming a bump electrode on an aluminum electrode of said semiconductor device;

forming an aluminum oxide sufficient for the prevention of corrosion in a surface layer of said aluminum electrode that is exposed around said bump electrode; and electrically connecting the bump electrode to a terminal electrode on the circuit board through a bonding layer after forming the aluminum oxide layer.

2. The method for forming a mounted body including a semiconductor device according to claim 1, further comprising the step of filling a gap between the semiconductor device and the circuit board with an insulating resin.

3. The method for forming a mounted body including a semiconductor device according to claim 2, wherein the insulating resin has a hydroxyl group.

4. The method for forming a mounted body including a semiconductor device according to claim 1, wherein the bump electrode is formed by a wire bonding method using Au wire.

* * * * *